United States Patent
Lin et al.

(10) Patent No.: US 9,269,808 B2
(45) Date of Patent: Feb. 23, 2016

(54) METHOD AND APPARATUS FOR POWER DEVICE WITH DEPLETION STRUCTURE

(71) Applicant: Vanguard International Semiconductor Corporation, Hisnchu (TW)

(72) Inventors: Shin-Cheng Lin, Tainan (TW); Shang-Hui Tu, Jhubei (TW); Yu-Hao Ho, Keelung (TW); Wen-Hsin Lin, Jhubei (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 78 days.

(21) Appl. No.: 14/186,530

(22) Filed: Feb. 21, 2014

(65) Prior Publication Data

US 2015/0243780 A1 Aug. 27, 2015

(51) Int. Cl.
*H01L 29/78* (2006.01)
*H01L 29/66* (2006.01)
*H01L 29/10* (2006.01)
*H01L 29/06* (2006.01)
*H01L 29/08* (2006.01)
*H01L 21/265* (2006.01)

(52) U.S. Cl.
CPC ...... *H01L 29/7823* (2013.01); *H01L 21/26513* (2013.01); *H01L 29/0611* (2013.01); *H01L 29/0619* (2013.01); *H01L 29/086* (2013.01); *H01L 29/0865* (2013.01); *H01L 29/0878* (2013.01); *H01L 29/1083* (2013.01); *H01L 29/1095* (2013.01); *H01L 29/66659* (2013.01); *H01L 29/66681* (2013.01); *H01L 29/7835* (2013.01)

(58) Field of Classification Search
CPC ............ H01L 29/0619; H01L 29/1095; H01L 29/1083; H01L 29/7835; H01L 29/0865; H01L 29/086; H01L 29/7823; H01L 29/0611; H01L 29/66659
See application file for complete search history.

(56) References Cited

U.S. PATENT DOCUMENTS

| | | | |
|---|---|---|---|
| 6,168,983 B1 | 1/2001 | Rumennik et al. | |
| 6,207,994 B1 | 3/2001 | Rumennik et al. | |
| 6,468,847 B1 | 10/2002 | Disney | |
| 6,509,220 B2 | 1/2003 | Disney | |
| 6,570,219 B1 | 5/2003 | Rumennik et al. | |
| 6,639,277 B2 * | 10/2003 | Rumennik | H01L 29/0619 257/339 |
| 8,154,078 B2 * | 4/2012 | Chang | H01L 29/0634 257/338 |
| 8,264,015 B2 | 9/2012 | Eklund | |
| 8,704,300 B1 * | 4/2014 | Lin | H01L 29/66659 257/335 |
| 8,912,599 B2 * | 12/2014 | Chen | H01L 29/7816 257/339 |

(Continued)

*Primary Examiner* — Joseph C Nicely
(74) *Attorney, Agent, or Firm* — Finnegan, Henderson, Farabow, Garrett & Dunner, LLP

(57) ABSTRACT

A semiconductor device is provided. The semiconductor device includes a substrate of a first conductivity type and an epitaxial structure of the first conductivity type disposed on the substrate. The semiconductor device further includes a well region having a first doping concentration of a second conductivity type disposed in the epitaxial structure and the substrate. The semiconductor device further includes a drain region and a source region respectively formed in the epitaxial structure inside and outside of the well region. The semiconductor device further includes a body region of the first conductivity type disposed under the source region, and a pair of first and second doped regions disposed in the well region between the drain region and the source region. The first and second doped regions extend outside of the well region and toward the body region.

42 Claims, 15 Drawing Sheets

(56) References Cited

U.S. PATENT DOCUMENTS

| | | | |
|---|---|---|---|
| 9,054,129 B1* | 6/2015 | Tu | H01L 29/6659 |
| 9,076,862 B2* | 7/2015 | Sulistyanto | H01L 29/7816 |
| 2002/0130361 A1* | 9/2002 | Imam | H01L 29/0634 |
| | | | 257/341 |
| 2011/0272758 A1* | 11/2011 | Banerjee | H01L 23/5252 |
| | | | 257/328 |
| 2013/0134512 A1* | 5/2013 | Cheng | H01L 29/402 |
| | | | 257/339 |
| 2014/0124858 A1* | 5/2014 | Lin | H01L 29/66659 |
| | | | 257/343 |
| 2015/0243766 A1* | 8/2015 | Tu | H01L 29/66681 |
| | | | 257/329 |
| 2015/0243783 A1* | 8/2015 | Lee | H01L 29/7835 |
| | | | 257/339 |

* cited by examiner

METHOD AND APPARATUS FOR POWER DEVICE WITH DEPLETION STRUCTURE

FIELD

Example embodiments relate to a semiconductor device, and in particular, to a power semiconductor device with depletion structures and a method for manufacturing the same.

BACKGROUND

Semiconductor devices for high-voltage applications commonly use vertical double-diffused metal-oxide-semiconductor field effect transistors (VDMOSFETs) or laterally diffused metal-oxide-semiconductor field effect transistors (LDMOSFETs). In order to increase the breakdown voltage of high-voltage semiconductor devices, several methods are commonly employed, such as, reducing the doping concentration of a deep well region (or known as drift region in the art), increasing the depth of the drift region, or increasing the length of an isolation structure (often referred to as a field oxide layer) underlying a gate.

However, when the breakdown voltage of a high-power semiconductor device is increased by the above-described ways, the resistance in the ON state (ON-resistance) or the size of the transistor is increased as well, which undesirably reduces the performance of the device or increases the area of a semiconductor device.

Thus, there exists a need in the art for development of a semiconductor device exhibiting increased the breakdown voltage without increasing the ON-resistance or device size.

SUMMARY OF EMBODIMENTS

Consistent with this disclosure, a semiconductor device is provided. The semiconductor device includes a substrate having a first conductivity type, and a drain region, a source region, and a well region disposed in the substrate. The well region is disposed between the drain region and the source region and has a second conductivity type opposite to the first conductivity type. The semiconductor device further includes a body region having the first conductivity type and disposed under the source region. The semiconductor device further includes first and second doped regions disposed in the well region. The first doped region has the first conductivity type. The second doped region is stacked on the first doped region and has the second conductivity type. The first and second doped regions extend outside of the well region and toward the body region.

Consistent with the disclosure, a semiconductor device is provided. The semiconductor device includes a substrate having a first conductivity type, and a drain region, a source region, and a well region disposed in the substrate. The well region is disposed between the drain region and the source region, and has a second conductivity type opposite to the first conductivity type. The semiconductor device further includes a body region having the first conductivity type and disposed under the source region. The semiconductor device further includes first and second doped regions disposed within the well region. The first doped region has the first conductivity type. The second doped region is stacked on the first doped region and has the second conductivity type. The semiconductor device further includes third and fourth doped regions disposed to overlap a portion of the body region and a portion of the substrate between the body region and the well region. The third doped region has the first conductivity type. The fourth doped region is stacked on the first doped region and has the second conductivity type. The third and fourth doped regions are separated from the first and second doped regions.

Consistent with the disclosure, a semiconductor device is provided. The semiconductor device includes a substrate of a first conductivity type and an epitaxial structure of the first conductivity type disposed on the substrate. The semiconductor device further includes a well region having a first doping concentration of a second conductivity type disposed in the epitaxial structure and the substrate. The semiconductor device further includes a drain region and a source region respectively formed in the epitaxial structure inside and outside of the well region. The semiconductor device further includes a body region of the first conductivity type disposed under the source region. The semiconductor device further includes a pair of first and second doped regions disposed in the well region between the drain region and the source region. The first and second doped regions are of the first and second conductivity type, respectively, and are stacked vertically from bottom to top. The first and second doped regions extend outside of the well region and toward the body region.

Consistent with the disclosure, a method of manufacturing a semiconductor device is provided. The method includes forming a drain region, a source region, and a well region in a substrate of a first conductivity type. The well region is disposed between the drain region and the source region and has a second conductivity type opposite to the first conductivity type. The method further includes forming a body region having the first conductivity type under the source region, and implanting first and second implants into the well region and a portion between the well region and the body region to form first and second doped regions. The first doped region has the first conductivity type. The second doped region is stacked on the first doped region and has the second conductivity type.

Consistent with the disclosure, a method of manufacturing a semiconductor device is provided. The method includes forming a drain region, a source region, and a well region in a substrate of a first conductivity type. The well region is disposed between the drain region and the source region and has a second conductivity type opposite to the first conductivity type. The method further includes forming a body region having the first conductivity type under the source region. The method further includes implanting first and second implants into the well region to form first and second doped regions. The first doped region has the first conductivity type. The second doped region is stacked on the first doped region and has the second conductivity type. The method further includes implanting the first and second implants into the body region and a portion between the well region and the body region to form third and fourth doped regions. The third doped region has the first conductivity type. The fourth doped region is stacked on the third doped region and has the second conductivity type.

Consistent with the disclosure, a method of manufacturing a semiconductor device is provided. The method includes forming an epitaxial structure of a first conductivity type on a substrate of the first conductivity type, and forming a well region having a second conductivity type in the epitaxial structure and the semiconductor substrate. The method further includes forming a drain region and a source region in the epitaxial structure inside and outside of the well region, and forming a body region of the first conductivity type under the source region. The method further includes implanting first and second implants into the well region and a portion of the epitaxial structure between the well region and the body region to form first and second doped regions. The first and second doped regions are of the first and second conductivity types, respectively, and are stacked vertically from bottom to top.

Consistent with the disclosure, a method of manufacturing a semiconductor device is provided. The method includes forming an epitaxial structure of a first conductivity type on a substrate of the first conductivity type, and forming a well region having a second conductivity type in the epitaxial structure and the semiconductor substrate. The method further includes forming a drain region and a source region in the epitaxial structure inside and outside of the well region. The method further includes forming a body region of the first conductivity type under the source region. The method further includes implanting first and second implants into the well region to form first and second doped regions. The first and second doped regions are of the first and second conductivity types, respectively, and are stacked vertically from bottom to top. The method further includes implanting the first and second implants into the body region and a portion of the epitaxial structure between the well region and the body region to form third and fourth doped regions. The third and fourth doped regions are of the first and second conductivity types, respectively, and are stacked vertically from bottom to top.

BRIEF DESCRIPTION OF THE DRAWINGS

Reference will now be made, by way of example, to the accompanying drawings which show example embodiments of the present application, and in which.

DESCRIPTION OF EXAMPLE EMBODIMENTS

Reference will now be made in detail to the example embodiments, which are illustrated in the accompanying drawings.

Figure 1A:
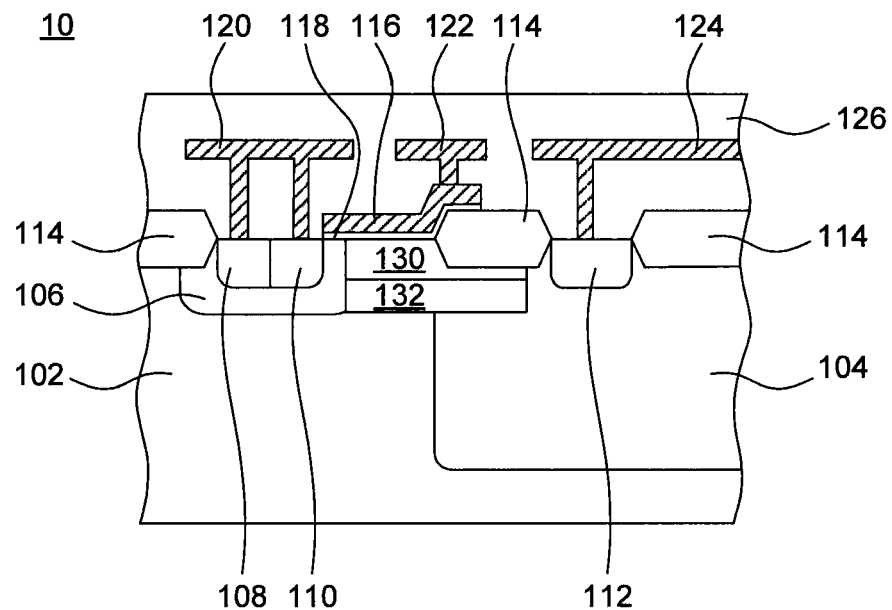
FIGS. 1(a)-1(d) show example power semiconductor devices consistent with some embodiments of this disclosure.
Figure 1B:
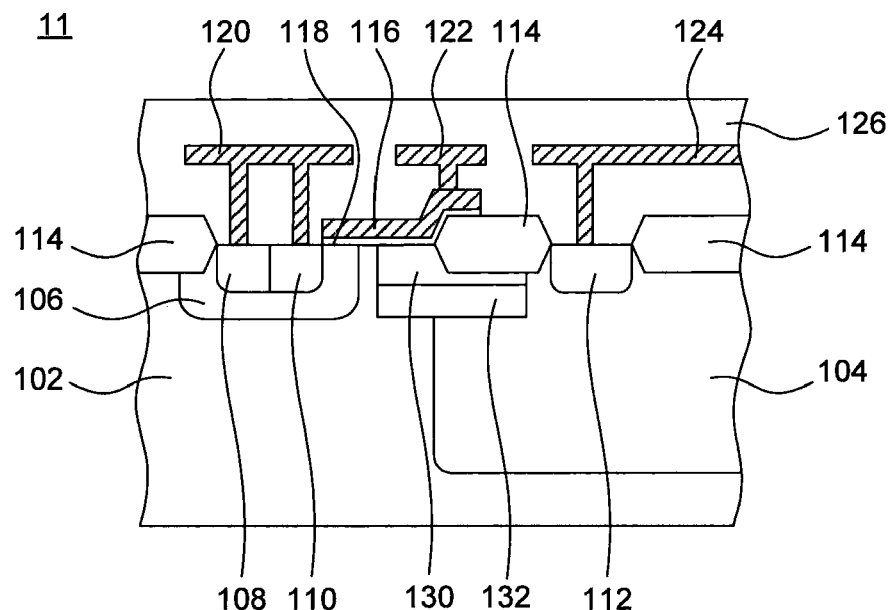

Referring now to the drawings, FIG. 1(a) shows an example power semiconductor device 10. Device 10 is a n-type device and includes a p-type semiconductor substrate 102. A gate structure 116 and a field insulating layer 114 are disposed on substrate 102. A gate insulating layer 118 is disposed between gate structure 116 and substrate 102. A portion of gate insulating layer 118 extends to cover a portion of field insulating layer 114. Moreover, a p-type body region 106 and an n-type well region 104 are respectively disposed in substrate 102 on either side of gate structure 116. A p-type contact region 108 and an adjacent n-type contact region 110 collectively form a source region disposed in body region 106, and an n-type contact region 112 forms a drain region in well region 104. Moreover, a p+ doped region 132 is disposed in well region 104 and extends outside of well region 104 toward body region 106. Device 10 further includes an n+ doped region 130 stacked on p+ doped region 132. N+ doped region 130 is also disposed in well region 104 and extends outside of well region 104 toward body region 106. In some embodiments, doped regions 130 and 132 may be extended to overlap a portion of the body region 106 but are not in contact with the source region. In some embodiments, doped regions 130 and 132 may extend outside of well region 104 but do not overlap body region 106, as shown in FIG. 1(b) which depicts an example device 11.

Moreover, a conductive source electrode 120 is electrically connected to p-type contact region 108 and n-type contact region 110. A conductive drain electrode 124 is electrically connected to n-type contact region 112. A conductive gate electrode 122 is electrically connected to gate structure 116. An interlayer dielectric layer 126 is disposed to cover electrodes 120, 122, 124.

Figure 1C:
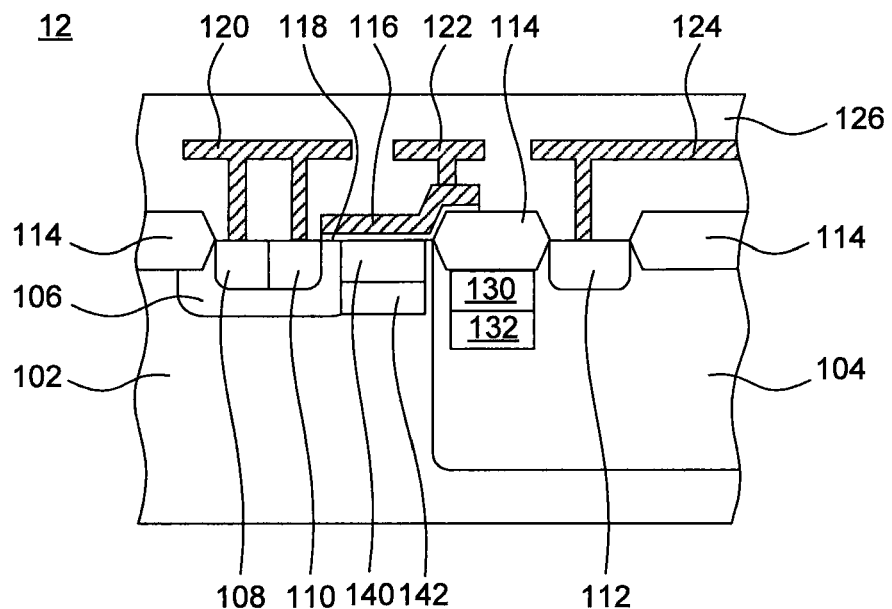

FIG. 1(c) shows an example power semiconductor device 12. Device 12 includes a first pair of n+ doped region 130 and p+ doped region 132 disposed within well region 104. Device 12 further includes a second pair of n+ doped region 140 and p+ doped region 142 disposed to overlap a portion of body region 106 and a portion of substrate 102 between well region 104 and body region 106. Note that the first pair of doped regions 130, 132 and the second pair of doped regions 140, 142 may be separated from each other. The other portions of device 12 are similar to those of device 10 as shown in FIG. 1(a), and will not be described here for brevity.

Figure 1D:
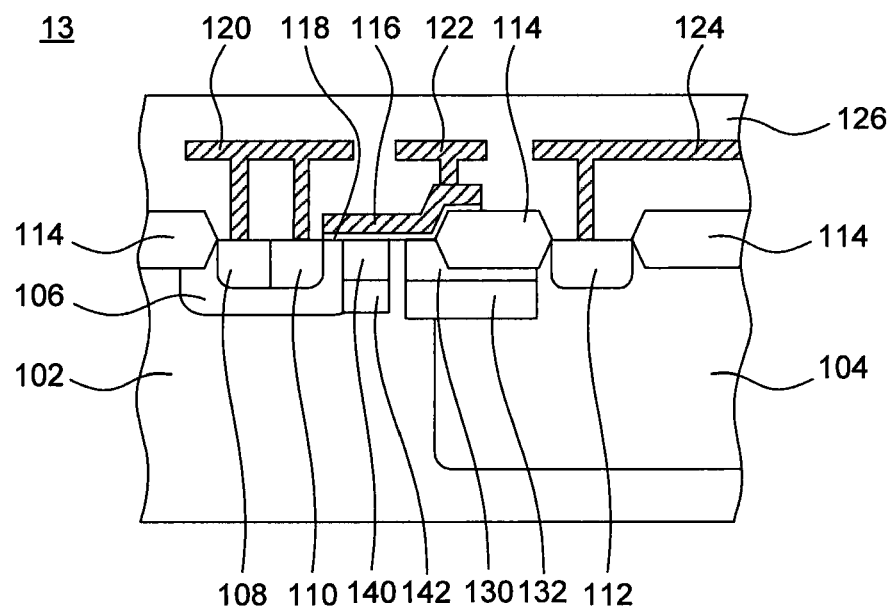

FIG. 1(d) depicts an example power semiconductor device 13. Device 13 includes a first pair of n+ doped region 130 and p+ doped region 132 disposed in well region 104. The first pair of doped regions 130, 132 extend outside of well region 104 toward body region 106 to cover a portion of substrate 102 between well region 104 and body region 106. Device 13 further includes a second pair of n+ doped region 140 and p+ doped region 142 disposed to overlap a portion of body region 106 and a portion of substrate 102 between well region 104 and body region 106. Note that the first pair of doped regions 130, 132 and the second pair of doped regions 140, 142 may be separated from each other. The other portions of device 13 are similar to those of device 10 as shown in FIG. 1(a), and will not be described here for brevity.

With the above example structures, it is possible to increase the breakdown voltage of a power semiconductor device and at the same time to reduce the ON-resistance. Moreover, because of the inclusion of doped regions 130, 132, 140, 142 in device 10, it is possible to reduce the overall size of the device, and therefore, increase the number of devices per unit area of substrate.

Figure 2A:
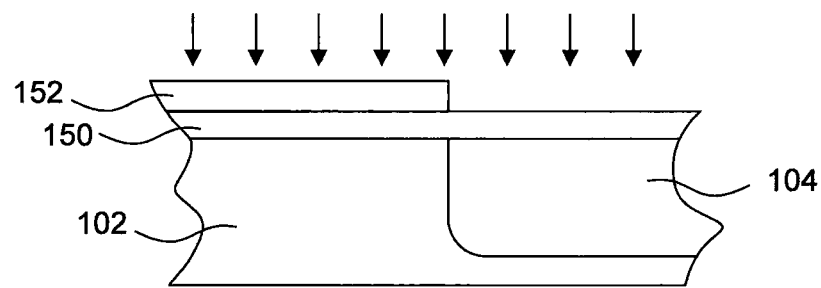
FIGS. 2(a)-2(h) show example methods of manufacturing power semiconductor devices consistent with some embodiments of this disclosure.

Next, example methods of manufacturing devices 10, 11, 12, 13 will be described with corresponding figures. Referring to FIG. 2(a), a p-type semiconductor substrate 102 is provided with a sacrificing layer 150. Semiconductor substrate 102 may be a silicon substrate, silicon on insulator (SOI) substrate, SiGe substrate, or other suitable semiconductor substrate. Sacrificing layer 150 may be, for example, an oxide, nitride, or oxynitride layer. An implantation protection layer 152, such as a photoresist layer, is provided on sacrificing layer 150. Implantation protection layer 152 is patterned to expose a region where an implant will be applied. Next, a n-type implant is implanted into substrate 102 to form well region 104. A doping concentration of the n-type implant for well region 104 is set to be higher than that of substrate 102, and may be, for example, about 1e11 to 1e13 atoms/cm$^2$ or about 1e11 to 5e12 atoms/cm$^2$. After forming well region 104, implantation protection layer 152 is removed from sacrificing layer 150.

Figure 2B:
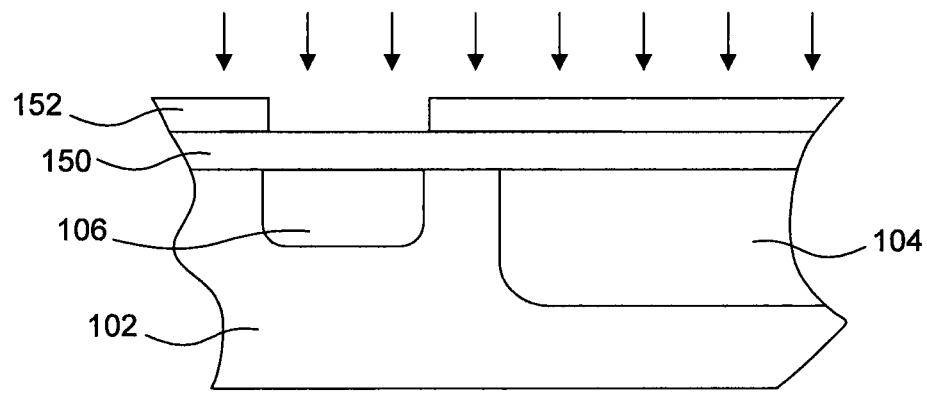

Referring to FIG. 2(b), a p-type body region 106 is formed. That is, another implantation protection layer 152 is provided and patterned to expose a region where an implant will be applied. A p-type implant is implanted into substrate 102 to form body region 106. A doping concentration of the p-type implant for body region 106 may be set to be, for example, about 1e11 to 1e14 atoms/cm$^2$.

Figure 2C:
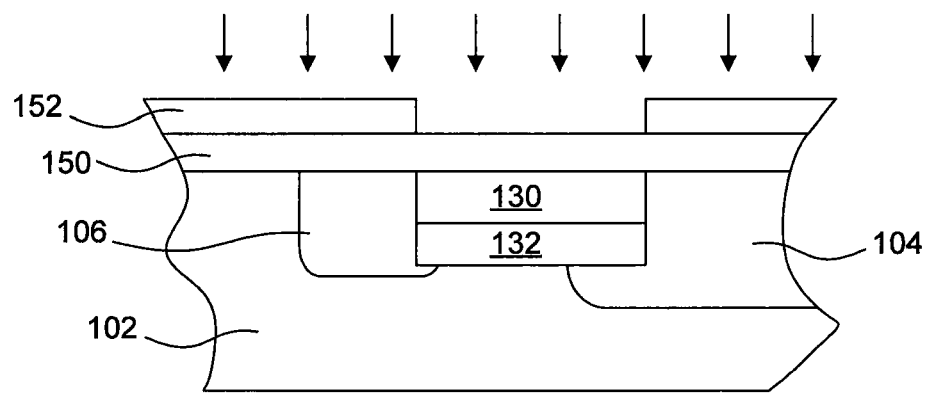

FIGS. 2(c)-2(f) depicts steps to form doped regions 130, 132, 140, 142 for devices 10, 11, 12, 13, respectively. Referring to FIG. 2(c) which illustrates example steps to form doped regions 130, 132 for device 10, a p+ doped region 132 and a n+ doped region 130 are formed in substrate 102 by implantation. P+ doped region 132 and n+ doped region 130 are stacked vertically from bottom to top. That is, sacrificing layer 150 implantation and protection layer 152 are provided and p-type and n-type implants are respectively implanted into substrate 102 to form p+ doped region 132 and n+ doped region 130. However, the sequence of the implantation is not so limited. For example, the p-type implant may be applied before the n-type implant so that p+ doped region 132 is formed before n+ doped region 130, or vice versa. Note that sacrificing layer 150 and implantation protection layer 152 in FIG. 2(c) may be different from those in FIG. 2(a) or 2(b). A doping concentration of the p-type implant for p+ doped region 132 or of the n-type implant for n+ doped region 130 may be set to be, for example, about 1e11 to 1e13 atoms/cm$^2$ so that the doping concentrations in doped regions 130, 132 are higher than that of well region 104. In some embodiments, a doping concentration of the p-type implant for p+ doped region 132 may be set to be higher than that of well region 104, while a doping concentration of the n-type implant for n+ doped region 130 may be set to be lower than that of well region 104.

As shown in FIG. 2(c), doped regions 130, 132 are formed in well region 104 and extended to a region between well region 104 and body region 106, and to cover a portion of the body region.

Figure 2D:
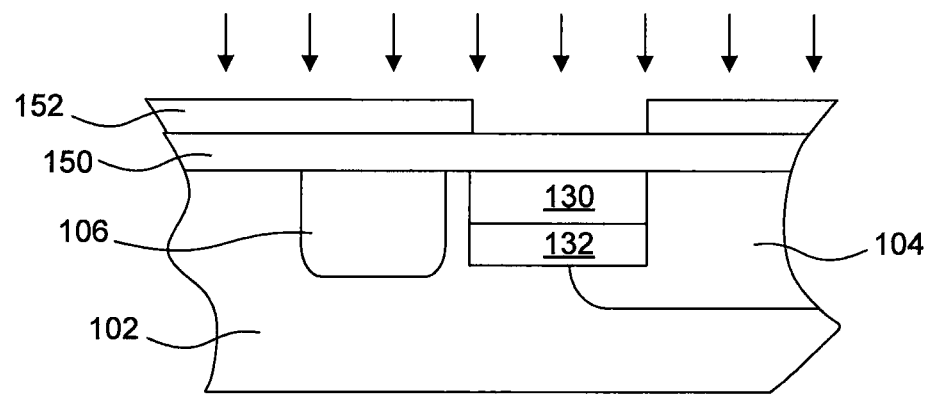

Similar to the above descriptions for FIG. 2(c), FIGS. 2(d), 2(e), 2(f) depict example steps to form doped regions 130, 132, 140, 142 for devices 11, 12, 13, respectively. Referring to FIG. 2(d), implantation protection layer 152 is patterned for an implantation process so that doped regions 130, 132 may be formed in well region 104 and to extend to a region between well region 104 and body region 106, so as not to cover a portion of the body region.

Figure 2E:
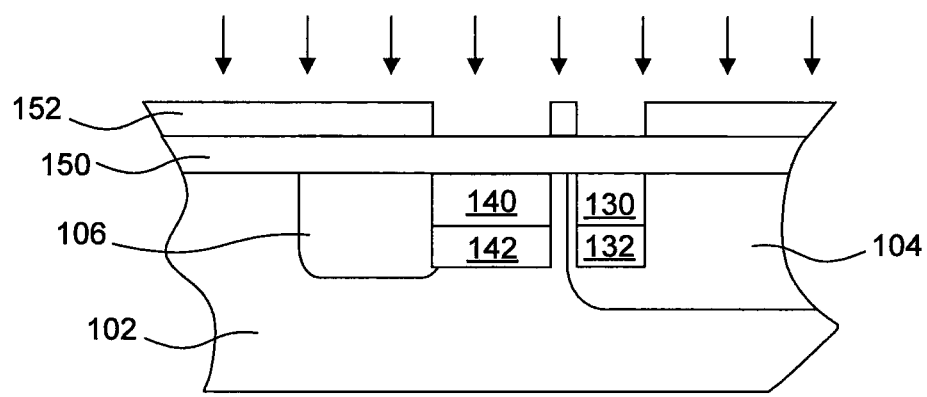

Referring to FIG. 2(e), implantation protection layer 152 is patterned for an implantation process so that a first pair of doped regions 130, 132 may be formed within well region 104 and that a second pair of doped regions 140, 142 may be formed to overlap a portion of body regions 106 and a portion of substrate 102 between well region 104 and body region 106. In some embodiments, doped regions 130, 140 may be formed simultaneously in the same implantation step so that doping concentrations for doped regions 130, 140 may be substantially same. Further, doped regions 132, 142 may be formed simultaneously in the same implantation step so that doping concentrations for doped regions 132, 142 may be substantially same.

Figure 2F:
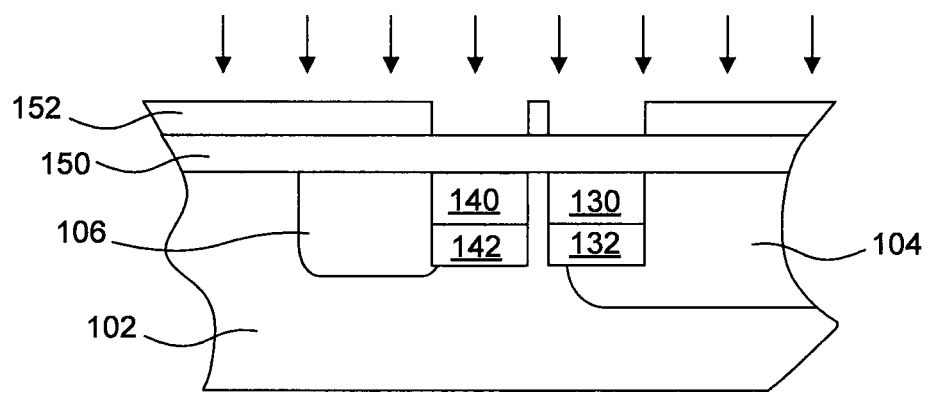

Referring to FIG. 2(f), implantation protection layer 152 is patterned for an implantation process so that a first pair of doped regions 130, 132 may be formed in well region 104 and that a second pair of doped regions 140, 142 may be formed to overlap a portion of body regions 106 and a portion of substrate 102 between well region 104 and body region 106. Note that the first pair of doped regions 130, 132 extend outside of well region 104 and overlap a portion of substrate 102 between well region 104 and body region 106. In some embodiments, doped regions 130, 140 may be formed simultaneously in the same implantation step. Further, doped regions 132, 142 may be formed simultaneously in the same implantation step.

Figure 2G:
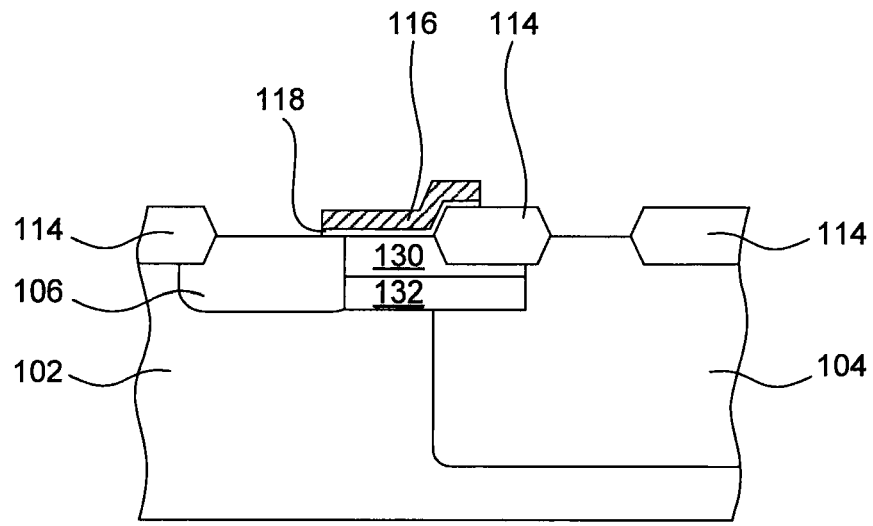

Example methods subsequent to FIGS. 2(c)-2(f) are common to each other. Thus, only methods to form device 10 are described below. Referring to FIG. 2(g), after well region 104, body region 106, and doped regions 130, 132 are formed in substrate 102 as shown in FIG. 2(c), an insulating layer 114 is formed on the surface of substrate 102. Insulating layer 114 may be, for example, an oxide, nitride, or oxynitride. Insulating layer 114 may be formed by oxidation and/or nitridation of the substrate, or deposition of oxide, nitride, and/or oxynitride materials on the substrate. As shown in FIG. 2(g), insulating layer 114 is formed on substrate 102 and patterned to expose a surface of well region 104, doped region 130, and body region 106.

Still referring to FIG. 2(g), a gate insulating layer 118 is formed on substrate 102 to cover a portion of insulating layer 114, and a surface of doped region 130 and body region 106. Gate insulating layer 118 may be, for example, an oxide, nitride, or oxynitride. Moreover, a gate structure 116 is formed on gate insulating layer 118. Gate structure 116 may be of polysilicon, metal, or metal silicide, or other conductive material. As shown in FIG. 2(g), doped regions 130, 132 are disposed under insulating layer 114 and gate insulating layer 118, and extend outside of a lateral boundary of insulating layer 114 adjacent to body region 106.

Figure 2H:
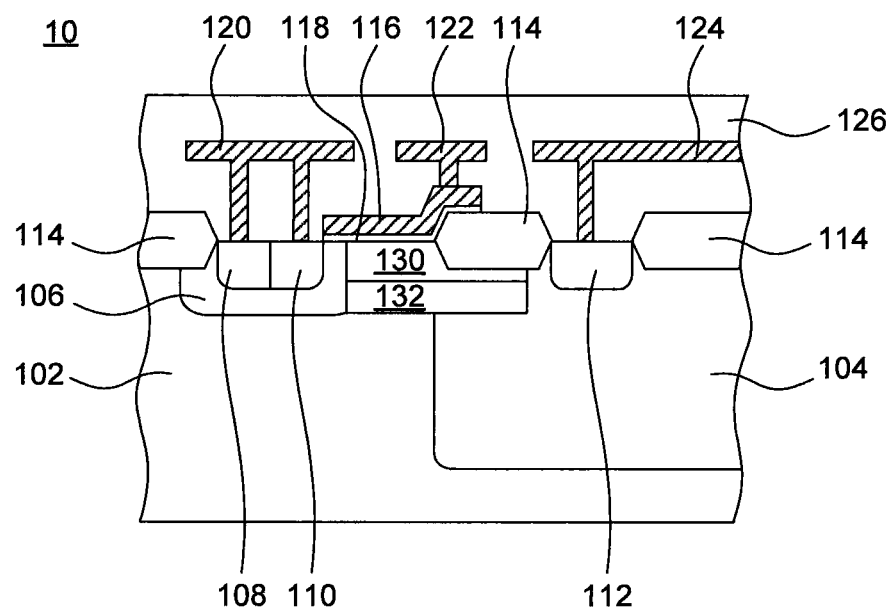
Figure 3A:
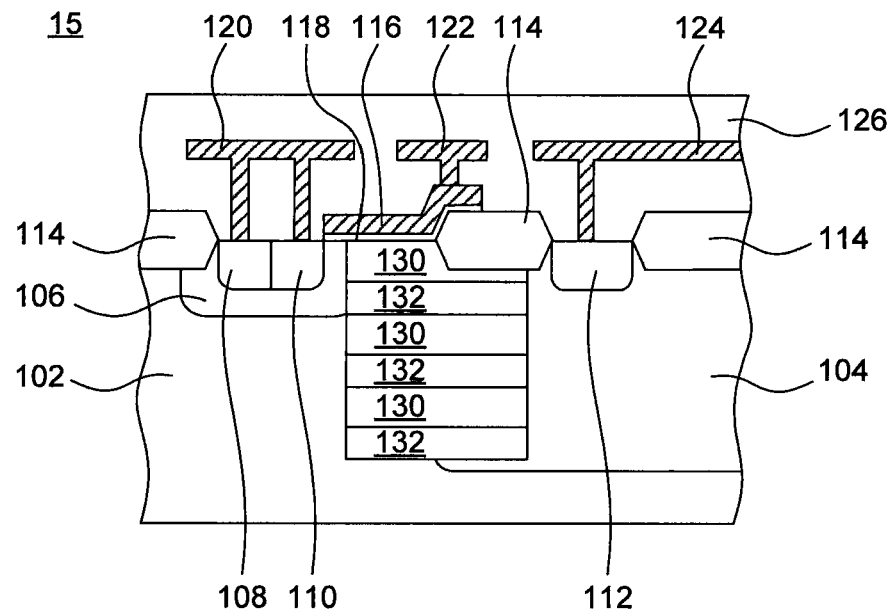
FIGS. 3(a)-3(d) show example power semiconductor devices consistent with some embodiments of this disclosure.
Figure 3B:
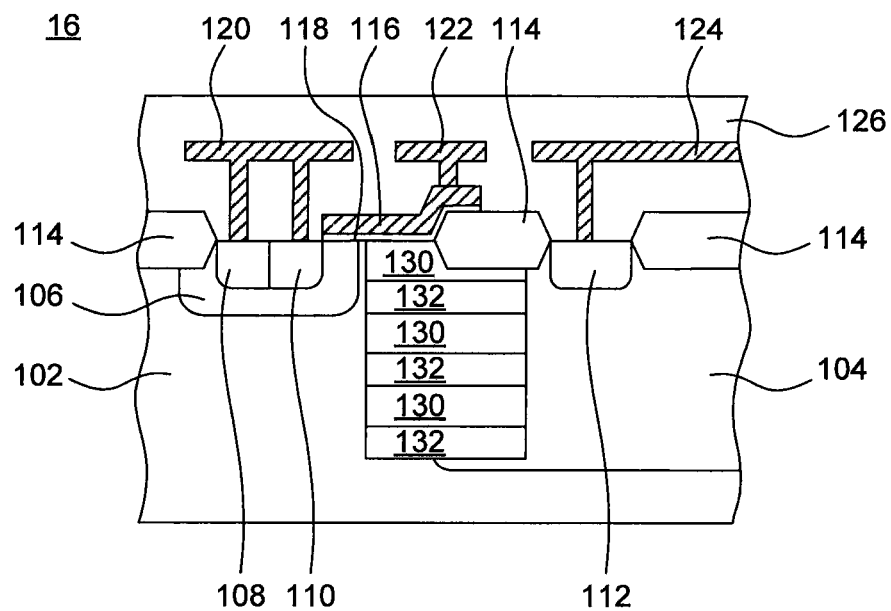
Figure 3C:
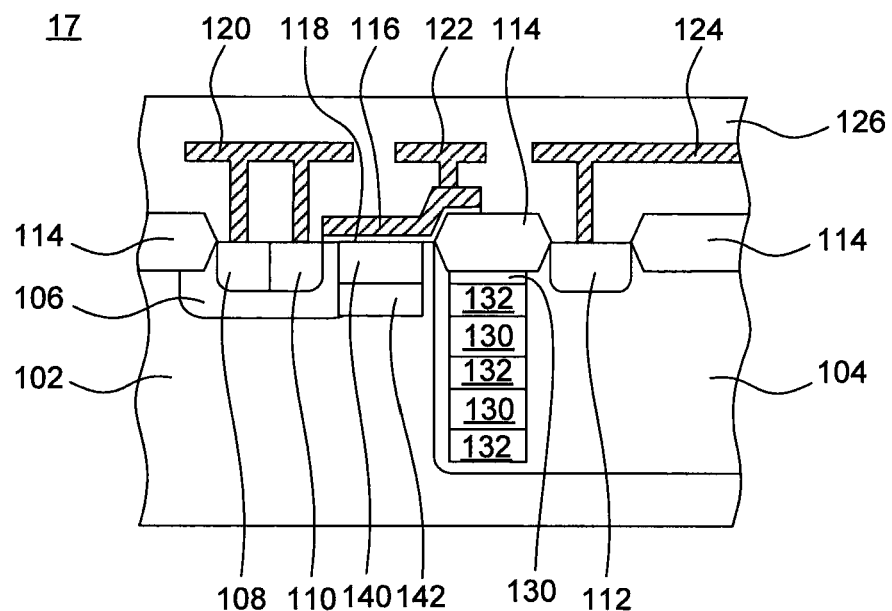
Figure 3D:
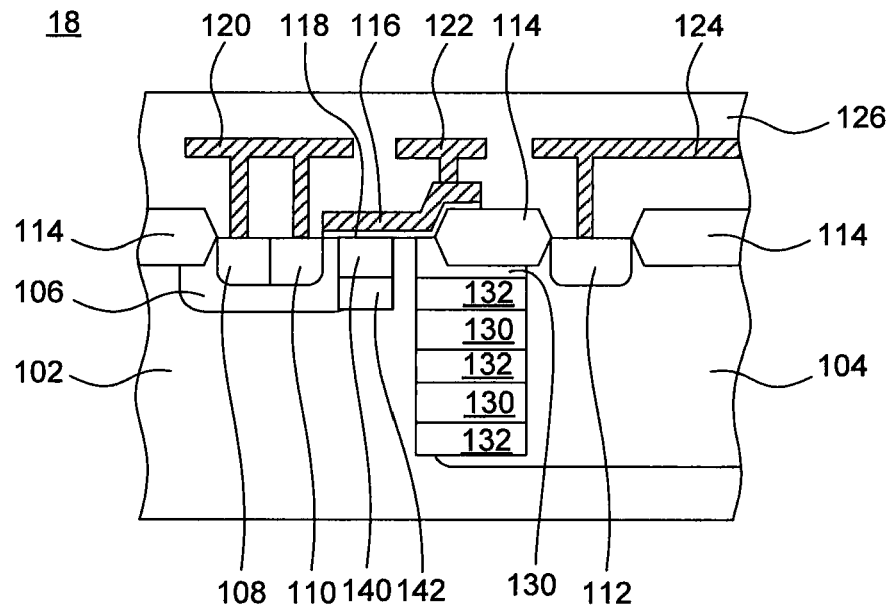

Referring to FIG. 2(h), a source region including p-type contact region 108 and an adjacent n-type contact region 110, and drain region 112 are respectively formed in body region 106 and well region 104. The source and drain regions may be formed by implanting corresponding implants into body region 106 and well region 104. Doping concentrations of the source and drain regions may be set at, for example, about 1e11 to 1e16 atoms/cm$^2$. In some embodiments, doping concentrations of the source and drain regions may be set at, for example, about 1e13 to 1e16 atoms/cm$^2$ or about 1e14 to 1e16 atoms/cm$^2$. In some embodiments, the doping concentrations for the source and drain regions may be set at different level. Thereafter, a source electrode 120 is formed to electrically connect to p-type contact region 108 and n-type contact region 110. A drain electrode 124 is formed to electrically connect to n-type contact region 112. A gate electrode 122 is formed to electrically connect to gate structure 116. These electrodes may be formed sequentially or at the same time. In addition, a material of these electrodes may be selected from polysilicon, metal, or metal silicide, or other conductive materials. In some embodiments, the materials of the electrodes and the gate structure may be the same. An interlayer dielectric layer 126 is deposited on substrate 102 to cover the electrodes. Although not illustrated, multiple layers of interconnection may be provided on the substrate in the power semiconductor device.

In some embodiments, more than one set of doped regions 130, 132 may be disposed in a power semiconductor device, as illustrated in FIGS. 3(a)-3(d). Elements in FIGS. 3(a)-3(d) that are the same as those in FIGS. 1(a)-1(d) are labeled with the same reference numbers as in FIGS. 1(a)-1(d) and are not described again, for brevity. For example, referring to FIGS. 3(a)-3(d), more than one pair of p+ doped region 132 and n+ doped region 130 may be vertically disposed in substrate 102. Three pairs of doped regions 130, 132 are shown in FIGS. 3(a)-3(d). The methods of manufacturing the power semiconductor devices 15-18 in FIGS. 3(a)-3(d) are similar to those described with respect to FIGS. 2(a)-2(h) with additional steps of forming the plurality of pairs of doped regions 130, 132. For example, multiple doped regions 130 may be formed by implanting a p-type implant with different implantation energy so as to reach different depths in the substrate. Similarly, multiple doped regions 132 may be formed by implanting an n-type implant with different implantation energy so as to reach different depths in the substrate.

Although the example power semiconductor devices described above are n-type devices, power semiconductor devices consistent with some embodiments can be p-type. The structure of a p-type power semiconductor device can be the same as those of the n-type power semiconductor device as described above, but the conductivity type of the materials in a p-type power semiconductor device is set to be opposite to that of the n-type power semiconductor device.

Figure 4A:
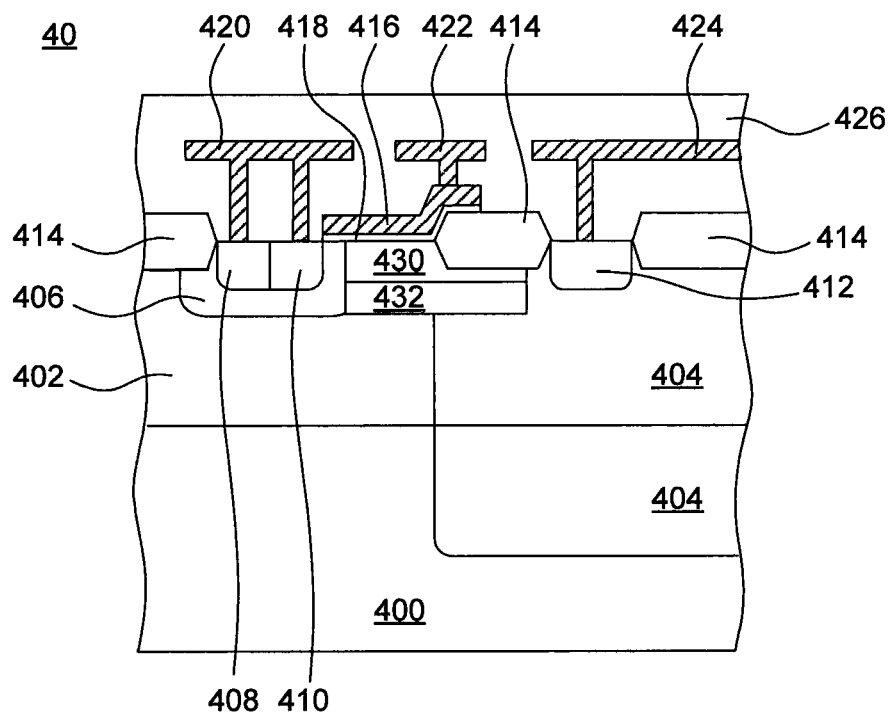
FIGS. 4(a)-4(e) show example power semiconductor devices consistent with some embodiments of this disclosure.

FIG. 4(a) depicts another power semiconductor device 40 consistent with embodiments of this disclosure. Device 40 is a n-type device and includes a p-type substrate 400 and an epitaxial layer 402 disposed on substrate 400. A gate structure 416 and a field insulating layer 414 are on epitaxial layer 402. A gate insulating layer 418 is disposed between gate structure 416 and epitaxial layer 402. A portion of gate insulating layer 418 extends to cover a portion of field insulating layer 414.

Moreover, a p-type body region 406 and an n-type well region 404 are respectively disposed in substrate 102 on either side of gate structure 416. N-type well region 404 is disposed in both substrate 400 and epitaxial layer 402. A p-type contact region 408 and an adjacent n-type contact region 410 collectively constitute a source region, which is disposed in body region 406. An n-type contact region 412 constitutes a drain region 412 and is disposed in well region 104. Moreover, a p+ doped region 432 is disposed in well region 404 in epitaxial layer 402 and extends outside of well region 404 toward body region 406. Device 40 further includes an n+ doped region 430 stacked on the p+ doped region 432. N+ doped region 430 is also disposed in well region 404 and extends outside of well region 404 toward body region 406. In some embodiments, doped regions 430 and 432 may be extended to overlap a portion of the body region 406 but are not in contact with source region 408/410. In some embodiments, doped regions 430 and 432 may be extended outside of well region 404 but do not overlap the body region 406.

Moreover, device 40 further includes a source electrode 420 electrically connected to the p-type contact region 408 and the n-type contact region 410. A drain electrode 424 is electrically connected to the n-type contact region 412. A gate electrode 422 is electrically connected to the gate structure 416. An interlayer dielectric layer 426 is disposed to cover the electrodes.

Figure 4B:
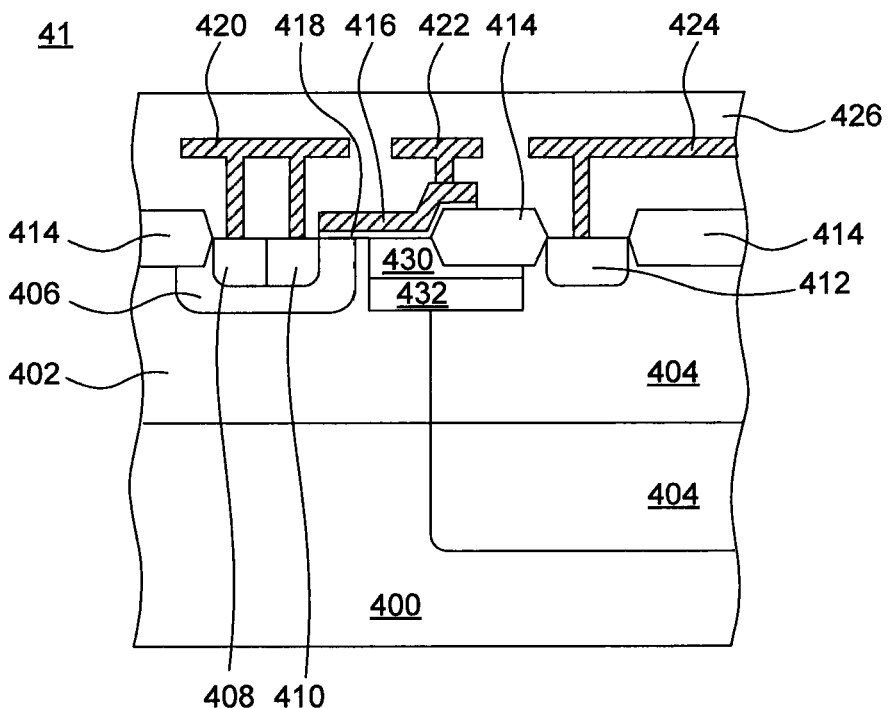

FIG. 4(b) depicts another power semiconductor device 41 consistent with embodiments of this disclosure. The structures of device 41 are the same as those of device 40, except that doped regions 430, 432 are extended from well region 404 of epitaxial layer 402 to overlap a portion of epitaxial layer 402 between well region 404 and body region 406 but not to overlap body region 406.

Figure 4C:
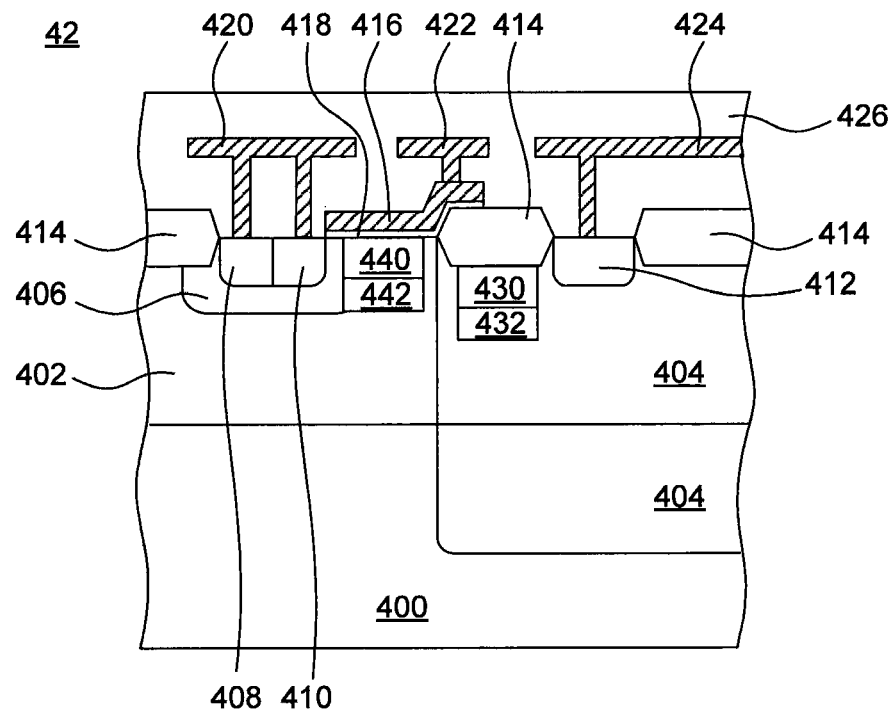

FIG. 4(c) depicts another power semiconductor device 42 consistent with embodiments of this disclosure. Device 42 includes a first pair of n+ doped region 430 and p+ doped region 432 disposed within well region 404 of epitaxial layer 402. Device 42 further includes a second pair of n+ doped region 440 and p+ doped region 442 disposed to overlap a portion of body region 406 and a portion of epitaxial layer 402 between well region 404 and body region 406. Note that the first pair of doped regions 430, 432 and the second pair of doped regions 440, 442 may be separated from each other. The other portions of device 42 are similar to those of device 40 as shown in FIG. 4(a), and will not be described here for brevity.

Figure 4D:
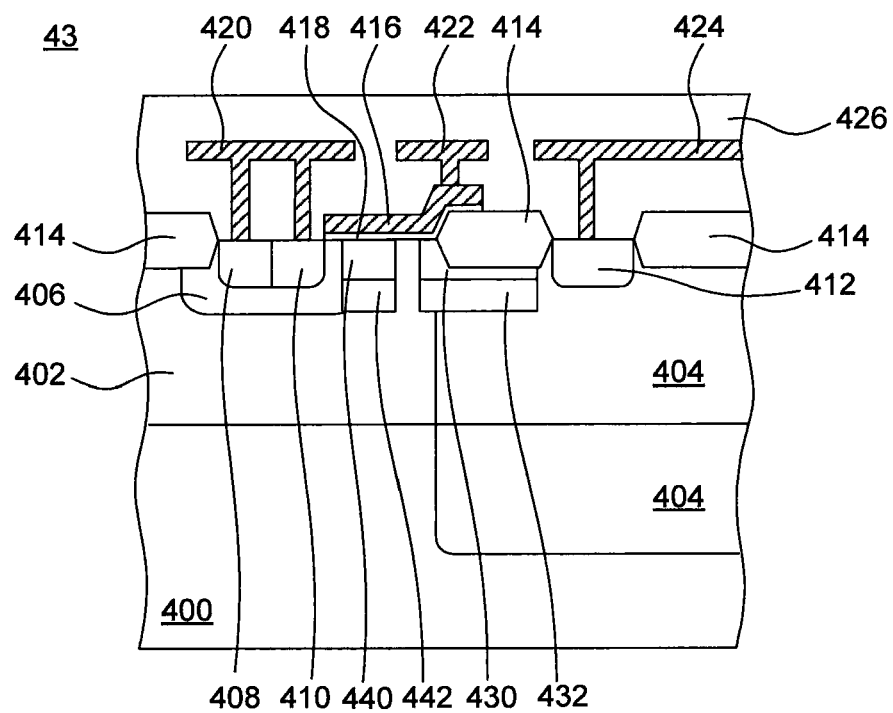

FIG. 4(d) depicts another power semiconductor device 43 consistent with embodiments of this disclosure. Device 43 includes a first pair of n-+ doped region 430 and p+ doped region 432 disposed in well region 404 of epitaxial layer 402. The first pair of doped regions 430, 432 extend outside of well region 404 toward body region 406 to cover a portion of epitaxial layer 402 between well region 404 and body region 406. Device 43 further includes a second pair of n+ doped region 440 and p+ doped region 442 disposed to overlap a portion of body region 406 and a portion of epitaxial layer 402 between well region 404 and body region 406. Note that the first pair of doped regions 430, 432 and the second pair of doped regions 440, 442 may be separated from each other. The other portions of device 43 are similar to those of device 40 as shown in FIG. 4(a), and will not be described here for brevity.

Figure 4E:
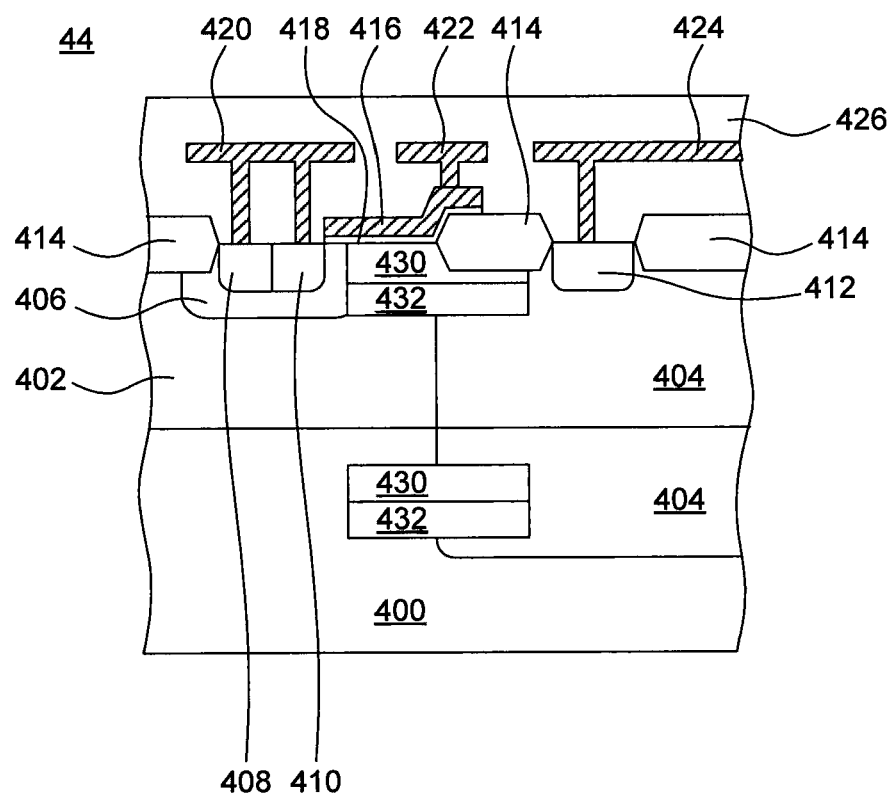

FIG. 4(e) depicts another power semiconductor device 44 consistent with embodiments of this disclosure. The structures of device 44 are the same as those of device 40, except that device 44 further includes an additional pair of n+ doped region 430 and p+ doped region 432 disposed in substrate 400. Doped regions 430, 432 of substrate 400 are disposed in well region 404 of the substrate, and extend outside of well region 404.

Figure 5A:
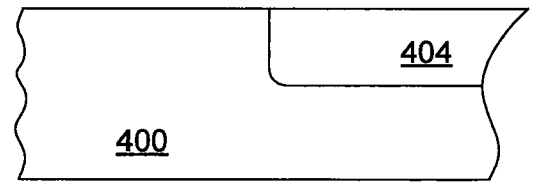
FIGS. 5(a)-5(h) show example methods of manufacturing power semiconductor devices consistent with some embodiments of this disclosure.

Next, example methods of manufacturing devices 40-44 as shown in FIGS. 4(a)-4(e), respectively, will be described with corresponding figures. Referring to FIG. 5(a), a p-type semiconductor substrate 400 is provided and a well region 404 is formed in semiconductor substrate 400 by, for example, implantation. The method of forming well region 404 is similar to those described with respect to FIG. 2(a) and thus will be omitted for brevity. Semiconductor substrate 400 may be a silicon substrate, silicon on insulator (SOI) substrate, SiGe substrate or other suitable semiconductor substrate. A doping concentration of the n-type implant implanted into well region 404 is set to be higher than that of substrate 102, and may be, for example, about 1e11 to 1e13 atoms/cm$^2$.

Figure 5B:
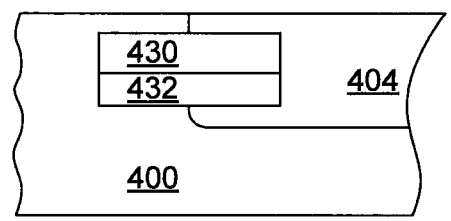

Referring to FIG. 5(b), a pair of p+ doped region 432 and n+ doped region 430 is formed in substrate 400 by implantation. Doped regions 430, 432 are formed in well region 404 and extend outside of well region 404 into the non-well portion of substrate 400. A doping concentration of a p-type implant for p+ doped region 432 or of an n-type implant for n+ doped region 430 may be set to be, for example, about 1e11 to 1e13 atoms/cm$^2$ so that the doping concentrations in doped regions 430, 432 are higher than that of well region 404. As shown in FIG. 5(b), the pair of doped regions 430, 432 may be buried under the upper surface of substrate 400. Alternatively, doped regions 430, 432 may be formed so as to be in contact with the upper surface of substrate 400. Alternatively, to form devices 40-43 as shown in FIGS. 4(a)-4(d), the processes to form doped regions 430, 432 in substrate 400 may be omitted.

Figure 5C:
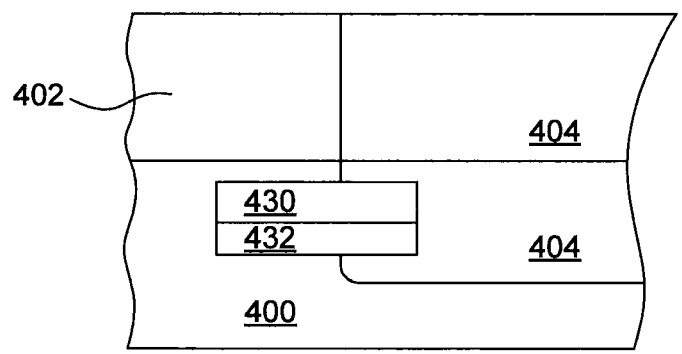

Referring to FIG. 5(c), a p-type epitaxial layer 402 is grown on substrate 400. Epitaxial layer 402 may include material(s) the same as or different from that of substrate 400. An n-type well region 404 is then formed in epitaxial layer 402 by implantation. The well region of epitaxial layer 402 is connected to the well region of substrate 400 to become a continuous well region.

Figure 5D:
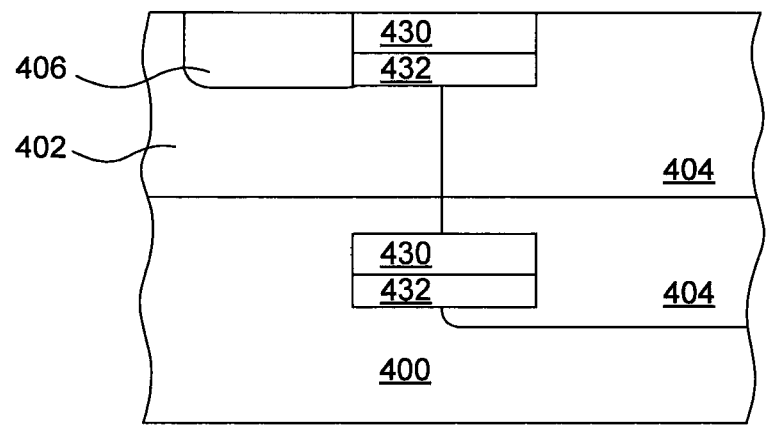

Referring to FIG. 5(d), a p-type body region 406 is formed in epitaxial layer 402 by implantation. A doping concentration of the p-type implant for the body region may be set to be, for example, about 1e11 to 1e14 atoms/cm$^2$. Body region 406 occupies a portion of the upper surface of epitaxial layer 402 and extends vertically in epitaxial layer 402. A second pair of p+ doped region 432 and n+ doped region 430 is formed in epitaxial layer 402 by implantation. During the formation processes, p-type and n-type implants are respectively implanted into epitaxial layer 402 to form p+ doped region 432 and n+ doped region 430. However, the sequence of the implantation is not limited. For example, the p-type implant may be applied before the n-type implant so that p+ doped region 432 is formed before n+ doped region 430, or vice versa.

Moreover, n+ doped region 430 is disposed to stack on p+ doped region 432 and a portion of n+ doped region 430 is exposed to the upper surface of epitaxial layer 402. A doping concentration of the p-type implant for p+ doped region 432 or of the n-type implant for n+ doped region 403 may be set to be, for example, about 1e11 to 1e13 atoms/cm$^2$ so that the doping concentrations in doped regions 430, 432 are higher than that of well region 404 of epitaxial layer 402. In some embodiments, a doping concentration of the p-type implant for p+ doped region 432 may be set to be higher than that of well region 404, while a doping concentration of the n-type implant for n+ doped region 430 may be set to be lower than that of well region 404.

As shown in FIG. 5(d), doped regions 430, 432 are formed in well region 404 and extended to a region between well region 404 and body region 406, and to cover a portion of body region 406. Alternatively, doped regions 430, 432 may be formed in well region 404 and extended to a region between well region 404 and body region 406, but do not cover a portion of body region 406.

Methods for forming doped regions 430, 432, 440, 442 of device 41, 42, or 43 in an epitaxial layer by implantation are similar to those described in connection with FIGS. 2(d)-2(f), and will not be described again, for brevity.

Figure 5E:
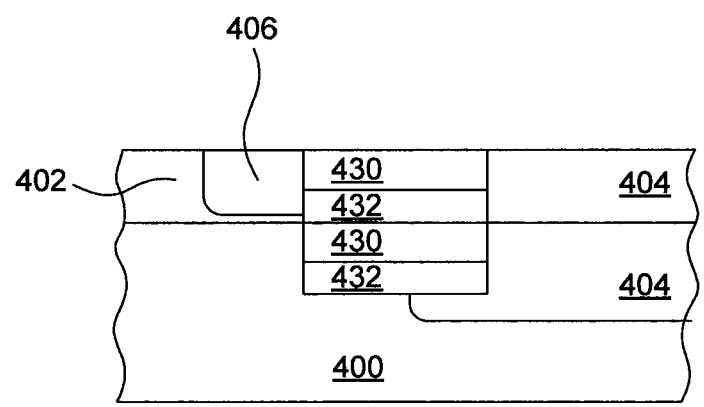
Figure 5F:
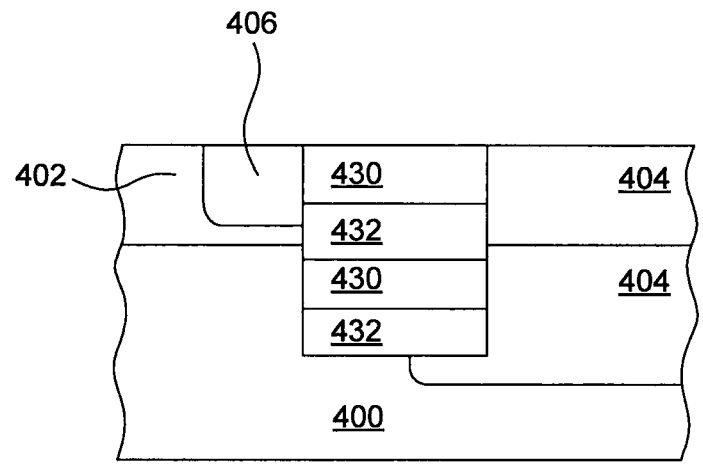

Referring to FIGS. 5(e), 5(f), consistent with some embodiments, the thickness of epitaxial layer 402 or the thickness of doped regions 430, 432 in epitaxial layer 402 may be controlled so that the second pair of doped regions 430, 432 in epitaxial layer 402 abuts against the first pair of doped regions 430, 432 in substrate 400. In some embodiments, the first pair of doped regions 430, 432 in substrate 400 is formed to be adjacent to the upper surface of substrate 400 so as to be abutted by the second pair of doped regions 430, 432 of epitaxial layer 402. In FIG. 5(e), the thickness of epitaxial layer 402 is controlled so that the second pair of doped regions 430, 432 in epitaxial layer 402 abuts against the first pair of doped regions 430, 432 in substrate 400 at about the interface between substrate 400 and epitaxial layer 402. In FIG. 5(f), the thickness of the second pair of doped regions 430, 432 in epitaxial layer is controlled so that a portion of doped region 432 extends to substrate 400 to abut against doped region 430 of substrate 400.

Figure 5G:
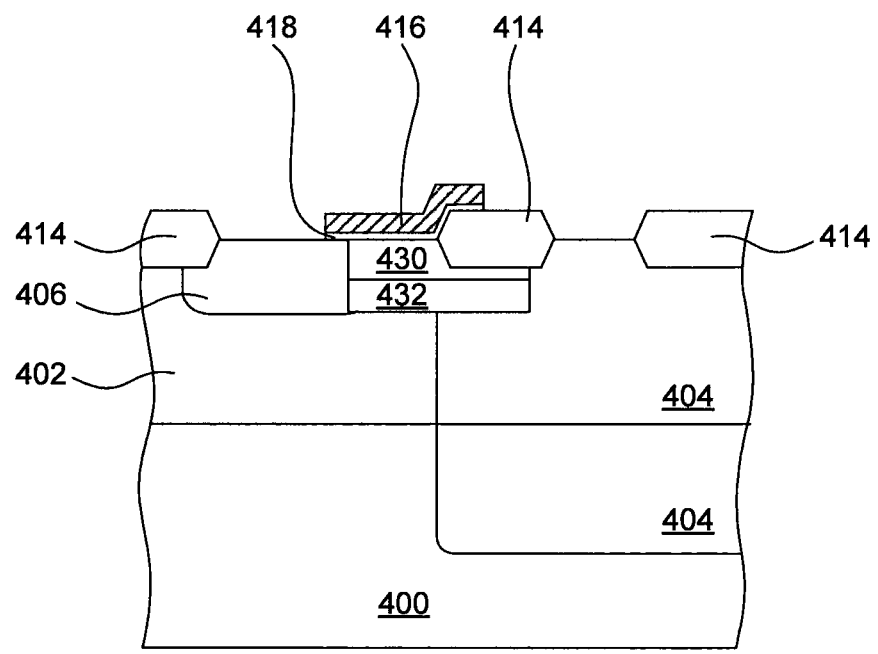

Referring to FIG. 5(g), after well region 404, body region 406, and doped regions 430, 432 are formed, an insulating layer 414 is formed on the surface of epitaxial layer 402. Insulating layer 414 may be, for example, an oxide, nitride, or oxynitride. Insulating layer 414 may be formed by oxidation and/or nitridation of epitaxial layer 402, or by deposition of oxide, nitride, and/or oxynitride materials on epitaxial layer 402. As shown in FIG. 5(g), insulating layer 414 is formed on epitaxial layer 402 and patterned to expose a surface of well region 404, doped region 430, and body region 406.

Still referring to FIG. 5(g), a gate insulating layer 418 is formed on epitaxial layer 402 to cover a portion of insulating layer 414, and a surface of doped region 430 and body region 406. Gate insulating layer 118 may be, for example, an oxide, nitride, or oxynitride. Moreover, a gate structure 416 is formed on gate insulating layer 118. Gate structure 116 may be a material selected from polysilicon, metal, or metal silicide, or other conductive materials. As shown in FIG. 5(g), doped regions 430, 432 are disposed under insulating layer 414 and gate insulating layer 418, and extend outside of a lateral boundary of insulating layer 414 adjacent to body region 406.

Figure 5H:
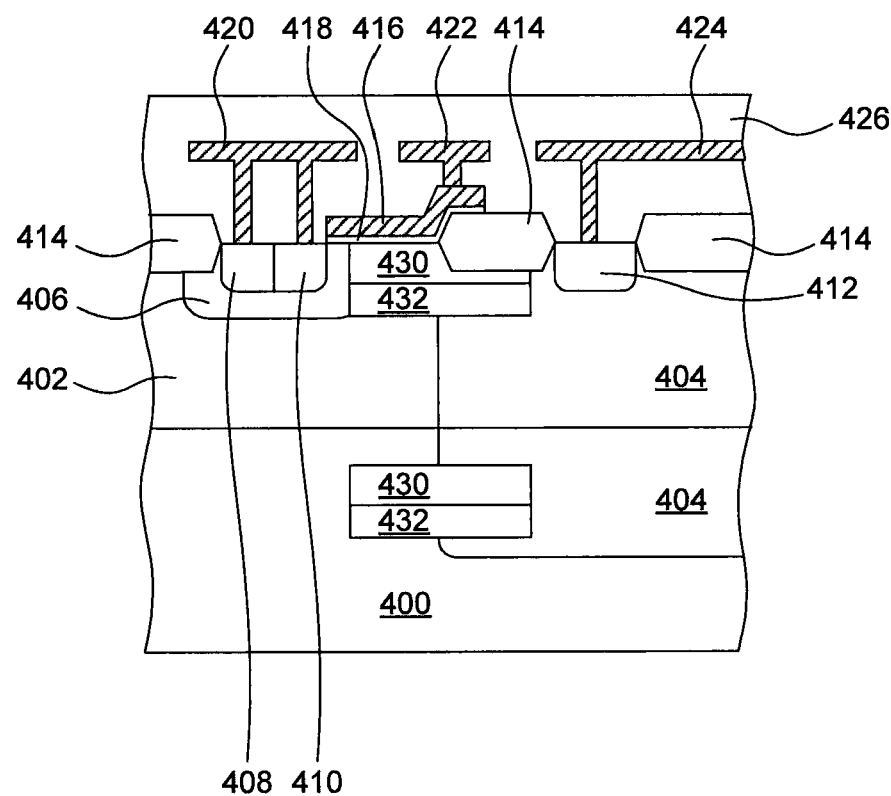

Referring to FIG. 5(h), a source region including p-type contact region 408 and an adjacent n-type contact region 410, and drain region 412 are respectively formed in body region 406 and well region 404. The source and drain regions may be formed by implanting corresponding implants into body region 406 and well region 404. Doping concentrations of the source and drain regions may be set at, for example, about 1e11 to 1e16 atoms/cm$^2$. In some embodiments, Doping concentrations of the source and drain regions may be set at, for example, about 1e13 to 1e16 atoms/cm$^2$ or about 1e14 to 1e16 atoms/cm$^2$. Thereafter, a conductive source electrode 420 is formed to electrically connect to p-type contact region 408 and n-type contact region 410. A conductive drain electrode 424 is formed to electrically connect to n-type contact region 412. A conductive gate electrode 422 is formed to electrically connect to gate structure 116. These electrodes may be formed sequentially or at the same time. In addition, a material of these electrodes may be selected from polysilicon, metal, or metal silicide, or other conductive materials. In some embodiments, the materials of the electrodes and the gate structure may be the same. An interlayer dielectric layer 426 is deposited on epitaxial layer 402 to cover the electrodes. Although not illustrated, multiple layers of interconnection may be provided on the electrodes in the power semiconductor device.

Although the example power semiconductor devices described above in FIGS. 4 and 5 are n-type devices, power semiconductor devices consistent with some embodiments can be p-type. The structure of a p-type power semiconductor device can be the same as those of the n-type power semiconductor device as described above, but the conductivity type of the materials in a p-type power semiconductor device is set to be opposite to that of the n-type power semiconductor device.

Figure 6:
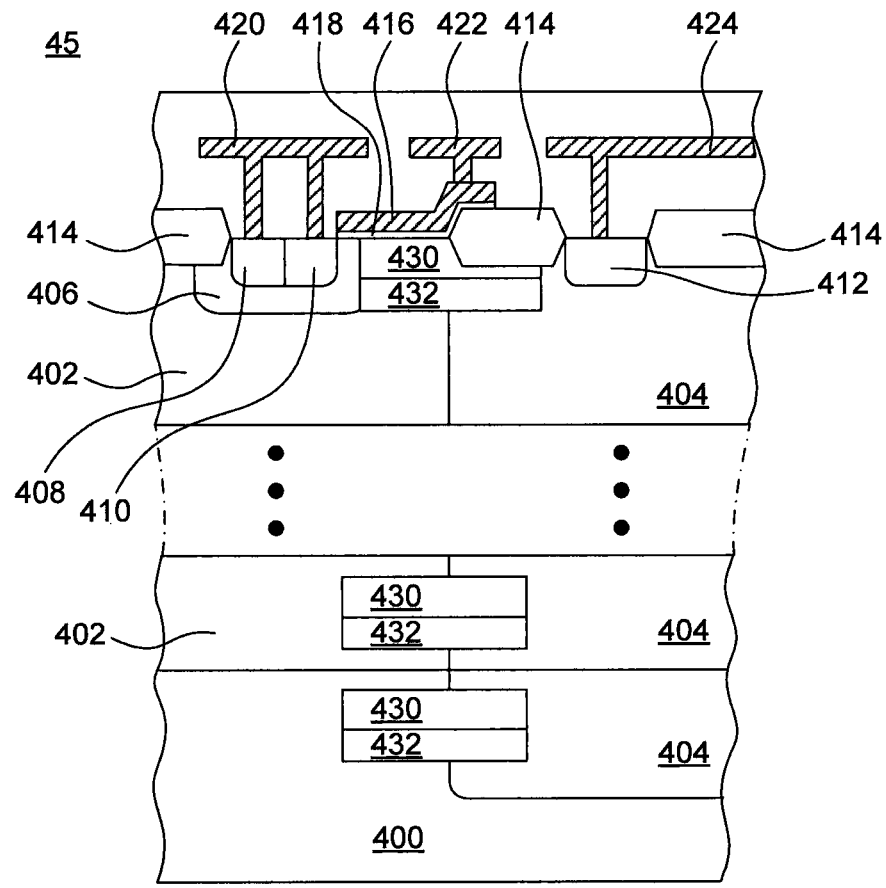
FIG. 6 shows another example power semiconductor device consistent with some embodiments of this disclosure.

In some embodiments, more than one epitaxial layer may be formed on substrate 400 in a power semiconductor device. Each epitaxial layer is provided with a well region and at least a pair of p+ doped region and n+ doped region. Referring to FIG. 6, an n-type power semiconductor device 45 includes a p-type substrate 400 and a plurality of epitaxial layers 402 formed on substrate 400. As described above, a well region 404 and a pair of p+ doped region 432 and n+ doped region 430 are formed in substrate 400 and each of epitaxial layers 402. It should be noted that well region 404 or doped regions 430, 432 in the substrate may be omitted. Although the doped regions 430, 432 in each of substrate 400 and epitaxial layers 402 are separated from each other in FIG. 6, these doped regions may be abut against each other as shown in FIGS. 5(e), 5(f).

Further, a p-type body region 406 is formed in the uppermost epitaxial layer. A source region including p-type contact region 408 and an adjacent n-type contact region 410, and drain region 412 are respectively formed in body region 406 and well region 404 in the uppermost epitaxial layer. Moreover, insulating layer 414, gate insulating layer 418, gate structure 416, source electrode 420, gate electrode 422, drain electrode 424, and interlayer dielectric layer 426 are arranged on the uppermost epitaxial layer similar to those illustrated in FIGS. 4 and 5.

Certain adaptations and modifications of the described embodiments can be made. Therefore, the above discussed embodiments are considered to be illustrative and not restrictive.

What is claimed is:

1. A semiconductor device comprising:
    a substrate having a first conductivity type;
    a drain region, a source region, and a well region disposed in the substrate, the well region being disposed between the drain region and the source region and having a second conductivity type opposite to the first conductivity type;
    a body region having the first conductivity type and disposed under the source region; and
    first and second doped regions disposed in the well region, the first doped region having the first conductivity type, and the second doped region being stacked on the first doped region and having the second conductivity type, the first and second doped regions extending outside of the well region and toward the body region.

2. The semiconductor device according to claim 1, wherein the first and second doped regions extend outside of the well region to overlap the body region.

3. The semiconductor device according to claim 1, further comprising third and fourth doped regions disposed to overlap a portion of the body region and a portion of the substrate between the body region and the well region, the third doped region having the first conductivity type and the fourth doped region being stacked on the first doped region and having the second conductivity type, the third and fourth doped regions being separated from the first and second doped regions.

4. The semiconductor device according to claim 1, further comprising:
    an insulating layer disposed above the well region, the insulating layer connected to the drain region and spaced apart from the source region;
    a gate insulating layer connected to the insulating layer and extended to cover a portion of the body region; and
    a gate disposed on the insulating layer and the gate insulating layer,
    the first and second doped regions being disposed under the insulating layer and the gate insulating layer, and extending outside of a lateral boundary of the insulating layer adjacent to the body region.

5. The semiconductor device according to claim 1, wherein:
    the well region is doped with a first doping concentration, the first doped region is doped with a second doping concentration, and the second doped region is doped with a third doping concentration; and
    each of the second doping concentration and third doping concentration is higher than the first doping concentration.

6. The semiconductor device according to claim 5, wherein the first doping concentration is about 1e11 to 1e13 atoms/cm$^2$.

7. The semiconductor device according to claim 1, wherein:
    the well region is doped with a first doping concentration, the first doped region is doped with a second doping concentration, and the second doped region is doped with a third doping concentration;
    the second doping concentration is higher than the first doping concentration; and
    the third doping concentration is lower than the first doping concentration.

8. The semiconductor device according to claim 7, wherein the first doping concentration is about 1e11 to 1e13 atoms/cm$^2$.

9. The semiconductor device according to claim 1, wherein the source region is doped with a doping concentration of about 1e14 to 1e16 atoms/cm$^2$.

10. The semiconductor device according to claim 1, wherein the drain region is doped with a doping concentration of about 1e14 to 1e16 atoms/cm$^2$.

11. The semiconductor device according to claim 1, wherein the body region is doped with a doping concentration of about 1e11 to 1e14 atoms/cm$^2$.

12. The semiconductor device according to claim 1, wherein the first conductivity type is p-type and the second conductivity type is n-type.

13. The semiconductor device according to claim 1, wherein the first conductivity type is n-type and the second conductivity type is p-type.

14. A semiconductor device, comprising:
    a substrate of a first conductivity type;
    an epitaxial structure of the first conductivity type disposed on the substrate;
    a well region having a first doping concentration of a second conductivity type disposed in the epitaxial structure and the substrate;
    a drain region and a source region formed in the epitaxial structure respectively inside and outside of the well region;
    a body region of the first conductivity type disposed under the source region; and
    a pair of first and second doped regions disposed in the well region between the drain region and the source region, the first and second doped regions being:
        of the first and second conductivity type, respectively;
        stacked vertically from bottom to top; and
        extending outside of the well region and toward the body region.

15. The semiconductor device according to claim 14, wherein:
    the epitaxial structure is composed of a single epitaxial layer; and
    the pair of first and second doped regions is disposed in the epitaxial layer.

16. The semiconductor device according to claim 14, wherein:
    the epitaxial structure is composed of a plurality of epitaxial layers; and
    the pair of first and second doped regions are disposed in the uppermost layer of the epitaxial layers.

17. The semiconductor device according to claim 16, wherein each of the epitaxial layers includes a pair of the first and second doped regions.

18. The semiconductor device according to claim 14, wherein the first and second doped regions extend outside of the well region to overlap the body region.

19. The semiconductor device according to claim 14, further comprising third and fourth doped regions disposed to overlap a portion of the body region and a portion of the epitaxial structure between the body region and the well region, the third doped region having the first conductivity type and the fourth doped region being stacked on the first doped region and having the second conductivity type, the third and fourth doped regions being separated from the first and second doped regions.

20. The semiconductor device according to claim 14, further comprising:

an insulating layer disposed above the well region, the insulating layer being connected to the drain region and spaced apart from the source region;

a gate insulating layer connected to the insulating layer and extended to cover a portion of the body region; and a gate disposed on the insulating layer and the gate insulating layer, the first and second doped regions being disposed under the insulating layer and the gate insulating layer, and extending outside of a lateral boundary of the insulating layer adjacent to the body region.

21. The semiconductor device according to claim 14, wherein:
the first doped region is doped with a second doping concentration and the second doped region is doped with a third doping concentration; and
each of the second doping concentration and the third doping concentration is higher than the first doping concentration.

22. The semiconductor device according to claim 14, wherein:
the first doped region is doped with a second doping concentration and the second doped region is doped with a third doping concentration;
the second doping concentration is higher than the first doping concentration; and
the third doping concentration is lower than the first doping concentration.

23. The semiconductor device according to claim 14, wherein the first doping concentration is about 1e11 to 1e13 atoms/cm$^2$.

24. The semiconductor device according to claim 14, wherein the source region is doped with a doping concentration of about 1e14 to 1e16 atoms/cm$^2$.

25. The semiconductor device according to claim 14, wherein the drain region is doped with a doping concentration of about 1e14 to 1e16 atoms/cm$^2$.

26. The semiconductor device according to claim 14, wherein the body region is doped with a doping concentration of about 1e11 to 1e14 atoms/cm$^2$.

27. The semiconductor device according to claim 14, wherein the first conductivity type is p-type and the second conductivity type is n-type.

28. The semiconductor device according to claim 14, wherein the first conductivity type is n-type and the second conductivity type is p-type.

29. A method of manufacturing a semiconductor device, comprising:
forming a drain region, a source region, and a well region in a substrate of a first conductivity type, the well region being disposed between the drain region and the source region and having a second conductivity type opposite to the first conductivity type;
forming a body region having the first conductivity type under the source region; and
implanting first and second implants into the well region and a first portion of the substrate between the well region and the body region to form first and second doped regions, the first doped region having the first conductivity type, the second doped region being stacked on the first doped region and having the second conductivity type.

30. The method according to claim 29, wherein the first and second doped regions are formed to overlap the body region.

31. The method according to claim 29, further comprising:
implanting the first and second implants into the body region and a second portion of the substrate between the well region and the body region to form third and fourth doped regions, the third doped region having the first conductivity type, the fourth doped region being stacked on the third doped region and having the second conductivity type.

32. The method according to claim 31, wherein the first and third doped regions are formed simultaneously.

33. The method according to claim 31, wherein the second and fourth doped regions are formed simultaneously.

34. The method according to claim 29, further comprising:
forming an insulating layer above the well region, the insulating layer being connected to the drain region and spaced apart from the source region;
forming a gate insulating layer to connect to the insulating layer and cover a portion of the body region; and
forming a gate on the insulating layer and the gate insulating layer,
the first and second doped regions being disposed under the insulating layer and the gate insulating layer, and extending outside of a lateral boundary of the insulating layer adjacent to the body region.

35. The method according to claim 29, wherein:
the well region is doped with a first doping concentration, the first doped region is doped with a second doping concentration, and the second doped region is doped with a third doping concentration; and
each of the second doping concentration and third doping concentration is higher than the first doping concentration.

36. The method according to claim 29, wherein:
the well region is doped with a first doping concentration, the first doped region is doped with a second doping concentration, and the second doped region is doped with a third doping concentration;
the second doping concentration is higher than the first doping concentration; and
the third doping concentration is lower than the first doping concentration.

37. The method according to claim 29, wherein the first conductivity type is p-type and the second conductivity type is n-type.

38. The method according to claim 29, wherein the first conductivity type is n-type and the second conductivity type is p-type.

39. A method of manufacturing a semiconductor device, comprising:
forming an epitaxial structure of a first conductivity type on a substrate of the first conductivity type;
forming a well region having a second conductivity type in the epitaxial structure and the semiconductor substrate;
forming a drain region and a source region in the epitaxial structure inside and outside of the well region;
forming a body region of the first conductivity type under the source region;
implanting first and second implants into the well region to form first and second doped regions, the first and second doped regions being of the first and second conductivity types, respectively, and being stacked vertically from bottom to top; and
implanting the first and second implants into the body region and a portion of the epitaxial structure between the well region and the body region to form third and fourth doped regions, the third and fourth doped regions being of the first and second conductivity types, respectively, and being stacked vertically from bottom to top.

40. The method according to claim 39, wherein the first and third doped regions are formed simultaneously.

41. The method according to claim 39, wherein the second and fourth doped regions are formed simultaneously.

42. The method according to claim 39, further comprising:
forming an insulating layer above the well region, the insulating layer being connected to the drain region and being spaced apart from the source region;
forming a gate insulating layer to connect to the insulating layer and cover a portion of the body region; and
forming a gate disposed on the insulating layer and the gate insulating layer,
the first and second doped regions being disposed under the insulating layer and the gate insulating layer, and extending outside of a lateral boundary of the insulating layer adjacent to the body region.

* * * * *